United States Patent [19]

Lin

[11] Patent Number: 5,508,556
[45] Date of Patent: Apr. 16, 1996

[54] LEADED SEMICONDUCTOR DEVICE HAVING ACCESSIBLE POWER SUPPLY PAD TERMINALS

[75] Inventor: Paul T. Lin, Austin, Tex.

[73] Assignee: Motorola, Inc., Schaumburg, Ill.

[21] Appl. No.: 298,961

[22] Filed: Sep. 2, 1994

[51] Int. Cl.⁶ ............ H01L 23/52; H01L 23/04; H01L 23/48; H01L 29/40
[52] U.S. Cl. ............ 257/691; 257/698; 257/780
[58] Field of Search ............ 257/691, 697, 257/780, 781, 786, 676, 698, 692, 693, 694

[56] References Cited

U.S. PATENT DOCUMENTS

| | | | |
|---|---|---|---|
| 4,530,002 | 7/1985 | Kanai | 257/697 |
| 4,558,346 | 12/1985 | Kida et al. | 357/74 |
| 4,700,473 | 10/1987 | Freyman et al. | 29/846 |
| 4,975,761 | 12/1990 | Chu | 357/72 |
| 4,992,628 | 2/1991 | Beppu et al. | 174/52.4 |
| 5,157,480 | 10/1992 | McShane et al. | 357/74 |
| 5,220,195 | 6/1993 | McShane et al. | 257/691 |
| 5,239,198 | 8/1993 | Lin et al. | 257/691 |
| 5,281,556 | 1/1994 | Shimizu et al. | 437/206 |

FOREIGN PATENT DOCUMENTS

| | | | |
|---|---|---|---|
| 60-759 | 1/1985 | Japan | 257/698 |
| 61-32558 | 2/1986 | Japan | 257/697 |
| 5-114683 | 5/1993 | Japan | 257/697 |

OTHER PUBLICATIONS

High Performance Multi Chip Carrier–IBM Technical Disclosure Bulletin vol. 33, No. 2, Jul. 1990.

*Primary Examiner*—Sara W. Crane
*Assistant Examiner*—S. V. Clark
*Attorney, Agent, or Firm*—Minh-Hien N. Clark

[57] ABSTRACT

A semiconductor die (14) is mounted over a power supply surface (24, 52, 62). Signal bonding pads (18) on the die are wire bonded to corresponding leads (38) of a leadframe. Power supply bonding pads (20, 21) on the die are wire bonded to the power supply surface. A package body (22, 42, 56) surrounds the semiconductor die, the wire bonds (32, 34, 40, 40'), and the power supply surface. The power supply pad terminals are accessible from the bottom of the package body of the device through a plurality of conductive apertures (28, 56) disposed in the lower half of the package body. Power supply solder bumps (12, 58) are connected to the power supply surface inside the package body through the conductive apertures. The leads are used provide input and out signals for the device around the periphery of the device, while the solder bumps are disposed in an array format on the package body.

19 Claims, 1 Drawing Sheet

LEADED SEMICONDUCTOR DEVICE HAVING ACCESSIBLE POWER SUPPLY PAD TERMINALS

CROSS-REFERENCE TO RELATED APPLICATION

Related material is disclosed in a pending application Ser. No. 08/239,169 by Paul-David Morrison entitled "Hermetic Semiconductor Device Having Jumper Leads" filed on May 6, 1994 and assigned to assignee hereof.

FIELD OF THE INVENTION

The present invention relates to a semiconductor device in general, and more specifically, to a leaded semiconductor device having accessible power supply pad terminals underneath the package body and a method for making the same.

BACKGROUND OF THE INVENTION

Semiconductor devices are increasingly becoming more complex with many integrated functions on a single die or chip. As a result, the semiconductor dice have increased in size due to the large number of bonding pads placed on the dice. These bonding pads include signal pads as well as power and ground pads. Typically, if a semiconductor die has 300 bonding pads, then one-third of those pads, or 100 pads, are ground pads. All of the bonding pads must be wire bonded to a leadframe having an equal or greater number of leads to accommodate all of the input and outputs pads as well as the ground pads.

A problem with this approach is that the leadframes become more difficult and more expensive to manufacturer for the following reasons. The pitch between leads has to be very small in order not to unduly increase package size. The downside to a fine pitch leadframe having more than 240 leads is that these high lead count leadframe cannot be stamped but rather must be etched, where etching is a more expensive manufacturing method not desirable for high volume demand. Additionally, some of these leadframes are multilayered to provide a ground plane for the devices. Manufacturing of a multilayer leadframe requires additional processing steps which can add cost to the leadframe. Moreover, a leadframe having a large number of leads will be larger than a similarly pitched leadframe having a lower number of leads. Since the industry trend is toward miniaturization where possible, a large size packaged device can pose design problems when board space is limited.

Hence, a need exists for a high lead count semiconductor device that can address the aforementioned challenges facing existing leaded devices.

DETAILED DESCRIPTION OF A PREFERRED EMBODIMENT

Figure 1:
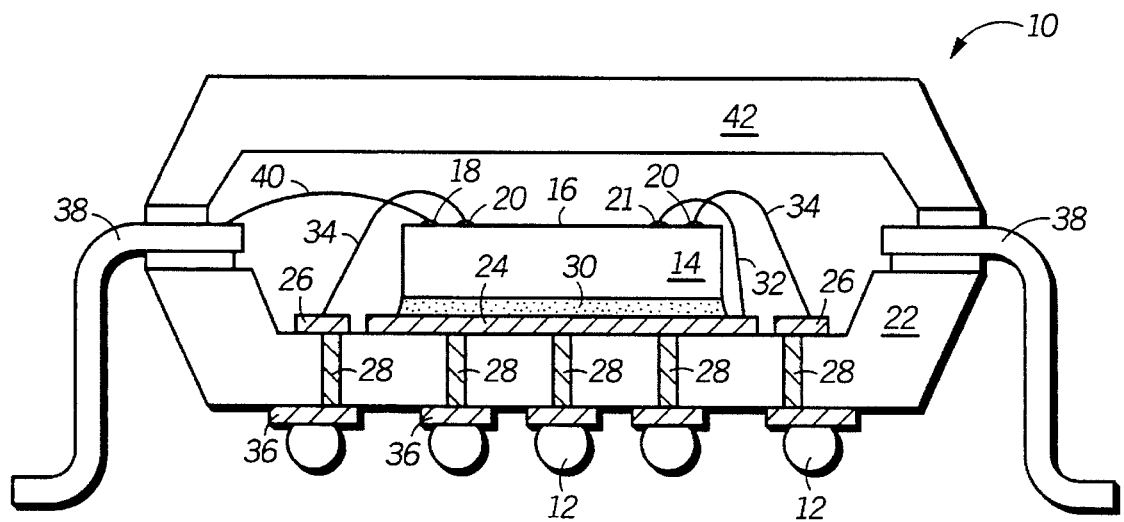
FIG. 1 illustrates, in cross-section, a leaded hermetic semiconductor device having power supply solder bumps, in a first embodiment of the present invention.

The present invention provides a leaded semiconductor device having power supply pad terminals which are accessible from the bottom of the package body of the device. An embodiment of the invention essentially contains a semiconductor die, a leadframe, a power supply surface, a package body having apertures therein, and solder bumps. The semiconductor die is mounted over the power supply surface. Signal bonding pads on the die are wire bonded to corresponding leads of the leadframe. Power supply bonding pads on the die are wire bonded to the power supply surface. The package body surrounds the semiconductor die, the wire bonds, and the power supply surface. The power supply solder bumps are connected to the power supply surface inside the package body through the plurality of apertures disposed in the lower half of the package body. The leads are used provide input and out signals for the device around the periphery of the device, while the solder bumps are disposed in an array format on the package body. The solder bumps are small enough so as to not interfere with the seating plane of the device during board mount. The balance of the solder volume can be provided by solder paste on the board mounting surface similar to the board mounting process for a regular quad flat pack (QFP) device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Furthermore, as the various figures depict many of the same or substantially similar elements in the different embodiments of the invention, like reference numerals are be used for the same or substantially similar elements.

FIG. 1 illustrates, in cross-section, a leaded hermetic semiconductor device 10 having power supply solder bumps 12 protruding from a bottom side of the package body, in a first embodiment of the present invention. As illustrated, device 10 has a semiconductor die 14 which has a plurality of bonding pads on the die surface 16. These bonding pads include both signal pads 18 and power supply pads 20 and 21. The term "power supply" is intended to include both power and ground. Although only a few representative bonding pads are shown, it should be understood that the semiconductor die 14 has a multiplicity of both signal pads and power supply pads. In fact, application of the present invention is most advantageous in cases where the die has 300 bonding pads or more, where typically one-third of these pads may be dedicated to power supply pads.

Device 10 of FIG. 1 also includes a base 22 which forms the bottom half of the package body for the device. Base 22 is preferably a single layer ceramic base, although other suitably electrically insulative materials may also be used for the base. The base 22 carries on its inner or upper surface some conductors comprising a ground plane 24 and a ring of power pad terminals 26 encircling the ground plane 24. The ring of power pad terminals 26 are physically and electrically isolated from the ground plane. These conductors may be of any suitably conductive metals which can be screened onto the base 22, but are preferably gold, palladium-silver, or other metallization materials with wire-bondable surface finishing.

The base 22 also has a plurality of conductive apertures 28 disposed underneath the ground plane 24 and the power pad terminals 26. These conductive apertures 28 extend through the thickness of the base and are typically filled vias (metallized vias). Methods for making these filled vias during the manufacturing of the ceramic bases are well known in the art. It may be possible to also fill these apertures with solder paste during assembly if the apertures are not already made conductive during manufacturing. However, this method of making the apertures conductive involves more processing complexity than the standard via filling process and should be performed prior to board mounting. These conductive apertures form a direct path for external electrical connection to the ground plane 24 and the power pad terminals 26 which are enclosed within the package body without the need for peripheral package leads.

The semiconductor die 14 is mounted onto the inner surface of the base 22 with an adhesive 30. The adhesive 30 is preferably electrically insulative and attaches the die 14 directly onto the ground plane 24. Alternatively, an electrically conductive adhesive may be used to attach the die provided that care is taken to prevent the adhesive 30 from overflowing from the ground plane 24 to the power pad terminals 26. Otherwise, shorting between power and ground would occur. A glass dam (not shown) between the ground plane and the ring of power pad terminals may be necessary to ensure isolation.

A first wire bond 32 connects the ground bonding pad 21 on the die surface 16 to the ground plane 24. It should be understood that all of the ground bonding pads 21 on the die surface 16 may be wire bonded down to the ground plane 24 to tie all of the ground pads together. In this manner, ground leads on a leadframe may be altogether eliminated, thus reducing the number of leads required on a leadframe. A second wire bond 34 connects the power bonding pad 20 to the power pad terminal 26 on the inner surface of the base 22. Depending on the metallurgy of the ground plane and the power pad terminals, the wire bonds may be aluminum, gold, or copper. Methods of wire bonding are known in the art.

As shown in FIG. 1, the plurality of solder bumps 12 are attached to the bottom of the base 22. Typically, there are metallized pads 36 on the surface of the base to allow easier attachment of the solder bumps. These metallized pads 36 provide the power and ground pads directly underneath the package body and would preferably be composed of the same material as the ground plane 24 and the power pad terminals 26. The metallized pads 36 may be centered about the conductive apertures 28 or offset if routing so requires. An advantage to using the surface area of the base for the power supply connections is that a corresponding number of leads can be eliminated from the leadframe, thus reducing the pitch of the required leadframe and the size of the leadframe. Moreover, complex multilayered leadframes are eliminated by practicing the present invention.

Also illustrated in FIG. 1, are signal leads 38 which are attached to the periphery of the base 22. As mentioned previously, power and ground leads are not necessary due to the ground plane and power pad terminals in the base, so a die having 300 bonding pads may only require a leadframe having 200 signal leads only. The space savings is can be substantial. The signal bonding pad 18 on the die surface 16 is electrically connected to the signal lead 38 with a third wire bond 40. Although only 1 wire bond is shown for ease and clarity of illustration, it should be noted that all of the signal bonding pads, if used, must be wire bonded to corresponding signal leads. The leads 38 may be attached to the base 22 with a standard glass embedding process. These leads extend outside the package body to provide peripheral leads for the device. The leads are formed into a surface-mountable configuration, such as a gull-wing shape as illustrated. The solder bump height should be smaller than the standoff height of the formed gull wing leads so as not to cause interference with board mounting pick and place operation.

The device 10 of FIG. 1 also includes a lid or cap 42 which overlies and is aligned to the base 22. The lid 42 completes the package body for the hermetic device 10. Suitable materials for the lid 42 can include, but is not limited to, ceramic, metal, a composite material, or a fiber reinforced material, as long as these materials can provide hermeticity. Additionally, although FIG. 1 illustrates a lid having a cavity therein, it is possible to have a flat cap depending on the loop height of the wire bonds, the thickness of the die, and the depth of the cavity in the base. The lid 42 is sealed to the periphery of the base 22 with an appropriate hermetic seal, such as glass or solder.

Figure 2:
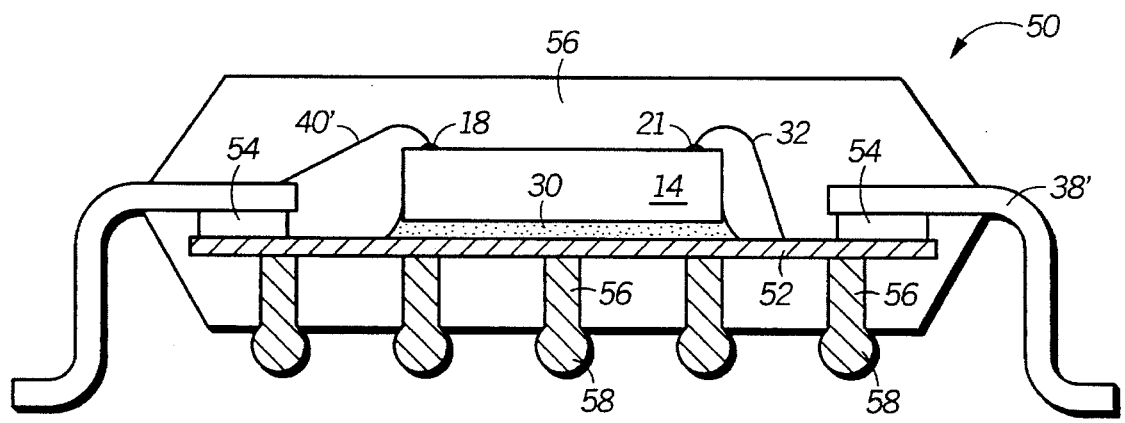
FIG. 2 illustrates, in cross-section, a leaded plastic encapsulated semiconductor device having ground solder bumps, in a second embodiment of the present invention.

FIG. 2 illustrates, in cross-section, a leaded plastic encapsulated semiconductor device 50 having ground solder bumps, in a second embodiment of the present invention. The semiconductor die 14 is mounted onto a ground plane 52 which is nonplanar with the leads 38'. Ground plane 52 serve as the die mounting surface so that the leadframe itself does have a die pad or flag as commonly found in leadframes. The adhesive 30 used to attach the die to the ground plane can be either electrically conductive or insulative, although in either case it is preferably thermally conductive. The ground plane 52 is sufficiently large to extend below the internal portion of the leads 38' and is attached to the underside of the leads 38' with an electrically insulative material 54, such as a polymer tape. The insulative tape 54 prevents the ground plane 52 from shorting to the leads 38'. The signal bonding pad 18 of the semiconductor die 14 is connected to the lead 38' with wire bond 40'. Although not specifically illustrated, power bonding pads would also be connected to appropriate power leads on the leadframe. The ground bonding pad 21 is connected to the ground plane 52 with wire bonds 32. It should be understood that a plurality of ground bonding pads are present on the die, and that they would be connected to the common ground plane 52. Additionally, if an electrically conductive adhesive 30 is used to mount the die, then the backside of the die can also be ground to the same potential as the ground plane 52.

Also illustrated in FIG. 2 is a plastic package body 56 which encapsulates the semiconductor die 14, the bonding wires 18 and 32, the ground plane 52, and a portion of the leads 38'. The package body 56 can be composed of any number of suitable molding compounds or encapsulants commercially available. As shown, package body 56 has a plurality of apertures 58 in the bottom half of the body. These apertures 56 are formed during the molding of the package body 56 through the use of ejector pins or something substantially similar. The diameter of these apertures should be approximately in a range of 5 to 15 mils (0.1 to 0.4 mm). The apertures allow external accessibility to the ground plane 52 which is otherwise encapsulated within the package body 56. Ground solder bumps 58 are disposed along the bottom surface of the package body to provide the external electrical connections to the ground plane 52. The bumps are made from a solder paste which fills the apertures 56 to provide a direct electrical path. These bumps would be subsequently mounted to appropriate pads on a board (not shown) along with the leads 38'. Note the difference between the height of the solder bumps and the seating plane of the device as determined by the external lead configuration. The solder bumps are small enough so as to not interfere with the seating plane of the device during board mount. The balance of the solder volume can be provided by solder paste on the board mounting surface similar to the board mounting process for a regular quad flat pack (QFP) device. Typically, the wet solder paste is approximately 8 to 12 mils (0.2 to 0.3 mm). Thus, the height of the solder bumps should not be 8 mils shorter than the seating plane so that the gap can be bridged by the solder paste on the board.

Figure 3:
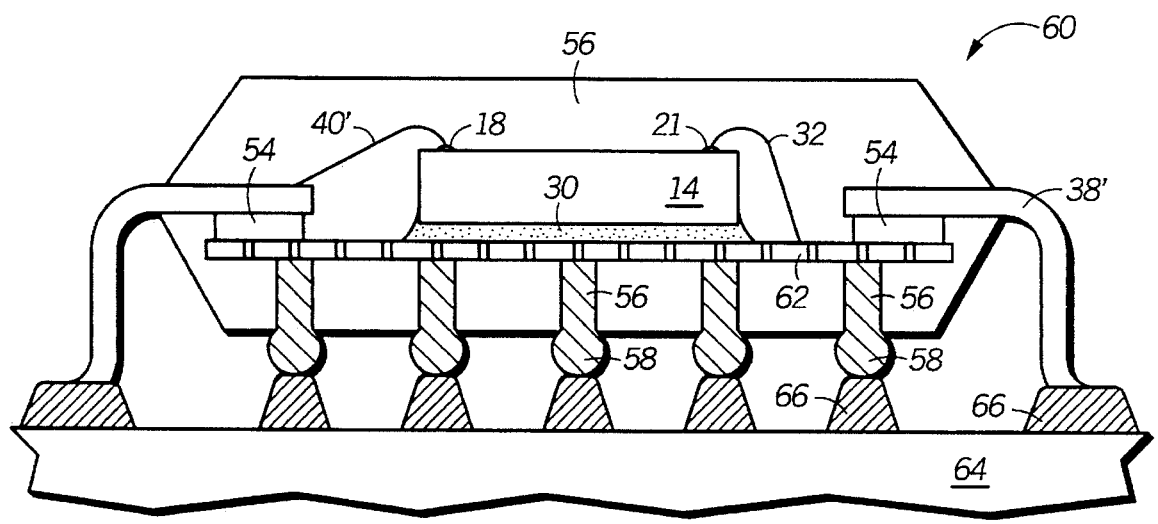
FIG. 3, illustrates, in cross-section, another leaded plastic encapsulated semiconductor device having ground solder bumps connected to a ground plane mesh, in a third embodiment of the present invention.

FIG. 3, illustrates, in cross-section, another leaded plastic encapsulated semiconductor device 60 having ground solder bumps 58, in a third embodiment of the present invention. This embodiment is substantially similar to that shown in FIG. 2 with a variation in the ground plane element. The ground plane 62 is composed of a metallic mesh instead of a solid plane. An advantage to having a mesh is that it improves the cavity filling characteristics of the molding compound because the compound can flow through the holes in the mesh. The holes in the mesh also serve to interlock the package body around the mesh. The interlocking helps to prevent delamination of the package body at the interface between the molding compound and the ground plane. In this embodiment, the apertures 56 should be spaced on close centers to ensure that the solder paste filling the apertures contacts metal to maintain electrical connectivity. Also illustrated in FIG. 3 are the solder connections 66 on the printed circuit board 64 which attach the leads as well as the solder bumps 58 to appropriate traces (not shown) on the board.

The foregoing description and illustrations contained herein demonstrate many of the advantages associated with the present invention. In particular, it has been revealed that embodiments of the invention improve electrical and thermal performance of a semiconductor device as compared to a standard QFP or CQFP. Moreover, the present invention allows a size reduction in a high pin count device. Yet another advantage is that stamped leadframes may be used to reduce cost of the device due to the reduction in the number of leads required on the leadframe for devices having a large number of I/Os. Additionally, the invention allows lead tips to be closer to the edges of semiconductor die since the overall number of leads has been reduced. Thus, one can assembly smaller die sizes in a particular package configuration without causing wire sweep problems.

Thus it is apparent that there has been provided, in accordance with the invention, a leaded semiconductor device having accessible power supply pad terminals on the bottom of the package body that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention may be applied to an anodized aluminum package such as an MQuad™. In addition, the invention is not limited to QFPs but may also be applied on dual in line packages (DIPs), small outline integrated circuits (SOICs), and plastic leaded chip carriers (PLCCs). Furthermore, the invention is in no way limited to high lead count packages but may also be applied to low lead count packages for increased electrical and thermal performance. Moreover, the gap between the solder bumps and the traces on a printed circuit board may be greater than 8 mils (0.2 mm) if a suitable amount of solder on the board is present to bridge the gap during board mounting. For example, if the traces are made very small and the amount of solder on the board is great, then the solder will "ball up" to a height greater than 8 mils (0.2 mm) to bridge the gap. Therefore, it is intended that this invention encompass all such variations and modifications falling within the scope of the appended claims.

I claim:

1. A leaded semiconductor device comprising:

a plurality of signal leads, each signal lead having an internal bonding post portion and an external lead portion;

a semiconductor die having a plurality of signal bonding pads and a plurality of power supply bonding pads on a die surface;

a power supply surface upon which the semiconductor die is adhesively attached, wherein the power supply surface is nonplanar with the plurality of signal leads;

a first plurality of electrical connections connecting the plurality of signal bonding pads to the plurality of signal leads;

a second plurality of electrical connections connecting the plurality of power supply bonding pads to the power supply surface;

a package body surrounding the semiconductor die, the first and second pluralities of electrical connections, the internal bonding post portion of each signal lead, and the power supply surface, wherein the package body has a bottom half having a plurality of conductive apertures disposed to expose a bottom surface portion of the power supply surface; and a plurality of solder bumps protruding from a bottom surface of the package body, the plurality of solder bumps being connected to the bottom surface portion of the power supply surface by way of the plurality of conductive apertures, such that the plurality of solder bumps is limited to providing a power supply connection and not a signal connection, wherein the external lead portion of each signal lead is configured to form a seating plane and wherein the plurality of solder bumps protrudes less than the seating plane to prevent interference with subsequent board mounting of the device.

2. The device of to claim 1, wherein the package body is composed of an encapsulating material.

3. A leaded semiconductor device comprising:

a plurality of signal leads, each signal lead having an internal bonding post portion and an external lead portion;

a semiconductor die having a plurality of signal bonding pads and a plurality of power supply bonding pads on a die surface;

a power supply surface upon which the semiconductor die is adhesively attached, wherein the power supply surface is nonplanar with the plurality of signal leads;

a first plurality of electrical connections connecting the plurality of signal bonding pads to the plurality of signal leads:

a second plurality of electrical connections connecting the plurality of power supply bonding pads to the power supply surface;

a package body composed of an encapsulating material surrounding the semiconductor die, the first and second pluralities of electrical connections, the internal bonding post portion of each signal lead, and the power supply surface, wherein the package body has a bottom half having a plurality of conductive apertures, having a diameter substantially in a range from 0.1 to 0.4 millimeter, disposed to expose a bottom surface portion of the power supply surface, and wherein conductivity is imparted by filling the plurality of apertures with a solder paste; and a plurality of solder bumps protruding from a bottom surface of the package body, the plurality of solder bumps being connected to the bottom surface portion of the power supply surface by way of the plurality of conductive apertures, wherein the external lead portion of each signal lead is configured to form a seating plane and wherein the plurality of solder bumps protrudes less than the seating plane to prevent interference with subsequent board mounting of the device.

4. The device of claim 3, wherein the power supply surface is composed of a conductive mesh having a plurality of holes therein.

5. A leaded semiconductor device comprising:

a plurality of signal leads, each signal lead having an internal bonding post portion and an external lead portion;

a semiconductor die having a plurality of signal bonding pads and a plurality of power supply bonding pads on a die surface;

a power supply surface upon which the semiconductor die is adhesively attached, wherein the power supply surface is nonplanar with the plurality of signal leads;

a first plurality of electrical connections connecting the plurality of signal bonding pads to the plurality of signal leads;

a second plurality of electrical connections connecting the plurality of power supply bonding pads to the power supply surface;

a package body surrounding the semiconductor die, the first and second pluralities of electrical connections, the internal bonding post portion of each signal lead, and the power supply surface, wherein the package body has a bottom half having a plurality of conductive apertures disposed to expose a bottom surface portion of the power supply surface; and a plurality of solder bumps protruding from a bottom surface of the package body, the plurality of solder bumps being connected to the bottom surface portion of the power supply surface by way of the plurality of conductive apertures, wherein the external lead portion of each signal lead is configured to form a seating plane and wherein the plurality of solder bumps protrudes less than the seating plane to prevent interference with subsequent board mounting of the device, wherein the plurality of solder bumps is no more than 0.2 millimeter shorter than a seating plane of the device.

6. A leaded semiconductor device comprising:

a plurality of signal leads numbering at least 200, each signal lead having an internal bonding post portion and an external lead portion;

a semiconductor die having a plurality of signal bonding pads and a plurality of power supply bonding pads on a die surface;

a power supply surface upon which the semiconductor die is adhesively attached, wherein the power supply surface is nonplanar with the plurality of signal leads;

a first plurality of electrical connections connecting the plurality of signal bonding pads to the plurality of signal leads;

a second plurality of electrical connections connecting the plurality of power supply bonding pads to the power supply surface;

a package body surrounding the semiconductor die, the first and second pluralities of electrical connections, the internal bonding post portion of each signal lead, and the power supply surface, wherein the package body has a bottom half having a plurality of conductive apertures disposed to expose a bottom surface portion of the power supply surface; and a plurality of solder bumps protruding from a bottom surface of the package body, the plurality of solder bumps being connected to the bottom surface portion of the power supply surface by way of the plurality of conductive apertures, wherein the external lead portion of each signal lead is configured to form a seating plane and wherein the plurality of solder bumps protrudes less than the seating plane to prevent interference with subsequent board mounting of the device.

7. The device of claim 1, wherein the package body is hermetic and is composed of a base and a lid, wherein the plurality of conductive apertures is in the base.

8. A leaded semiconductor device comprising:

a plurality of signal leads, each signal lead having an internal bonding post portion and an external lead portion;

a semiconductor die having a plurality of signal bonding pads and a plurality of power supply bonding pads on a die surface;

a power supply surface upon which the semiconductor die is adhesively attached, wherein the power supply surface comprises an inner ground plane and is nonplanar with the plurality of signal leads, the device further comprising an outer ring of power pad terminals which encircles the inner ground plane and which is electrically isolated from the inner ground plane, a first plurality of electrical connections connecting the plurality of signal bonding pads to the plurality of signal leads;

a second plurality of electrical connections connecting the plurality of power supply bonding pads to the power supply surface;

a hermetic package body surrounding the semiconductor die, the first and second pluralities of electrical connections, the internal bonding post portion of each signal lead, and the power supply surface, wherein the hermetic package body is composed of a lid and a base, the base having a plurality of conductive apertures disposed to expose a bottom surface portion of the power supply surface; and a plurality of solder bumps protruding from a bottom surface of the package body, the plurality of solder bumps being connected to the bottom surface portion of the power supply surface by way of the plurality of conductive apertures, wherein the external lead portion of each signal lead is configured to form a seating plane and wherein the plurality of solder bumps protrudes less than the seating plane to prevent interference with subsequent board mounting of the device.

9. The device of claim 8, wherein the plurality of conductive apertures is characterized as filled vias.

10. A leaded resin encapsulated semiconductor device comprising:

a plurality of signal leads, each signal lead having an internal bonding post portion and an external lead portion;

a semiconductor die having a plurality of signal bonding pads and a plurality of ground bonding pads on a die surface;

a ground plane upon which the semiconductor die is adhesively attached, wherein the ground plane extends underneath the internal bonding post portion of each signal lead and wherein the ground plane is adhesively attached to an underside of each signal lead with an electrically insulative adhesive;

a first plurality of wire bonds connecting the plurality of signal bonding pads to the plurality of signal leads;

a second plurality of wire bonds connecting the plurality of ground bonding pads to the ground plane;

a resin package body encapsulating the semiconductor die, the first and second pluralities of electrical connections, the internal bonding post portion of each signal lead, and the ground plane, wherein the resin package body has a bottom half having a plurality of apertures disposed to expose a bottom surface portion of the ground plane; and a plurality of solder bumps connected to the bottom surface portion of the ground plane by filling the plurality of apertures in the bottom half of the resin package body, wherein the external lead portion of each signal lead is configured to form a seating plane and wherein the plurality of solder bumps is protrudes less than the seating plane to prevent interference with subsequent board mounting of the device.

11. The device of claim 10, wherein the plurality of apertures in the bottom half of the resin package body has a diameter substantially in a range from 0.1 to 0.4 millimeter.

12. The device of claim 10, wherein the ground plane is composed of a conductive mesh having a plurality of holes therein.

13. The device of claim 10, wherein the plurality of solder bumps is no more than 0.2 millimeter shorter than a seating plane of the device.

14. The device of claim 10, wherein the plurality of solder bumps is composed of a hardened solder paste.

15. The device of claim 10, wherein the plurality of signal leads number at least 200.

16. A leaded hermetic semiconductor device comprising:

a single layer ceramic base carrying an inner ground plane on an inner surface of the base, an outer ring of power pad terminals encircling the inner ground plane and electrically isolated therefrom, and a plurality of conductive apertures extending through a thickness of the base disposed to expose a bottom surface portion of the ground plane and the power pad terminals;

a plurality of signal leads attached to a periphery of the single layer ceramic base, each signal lead having an internal bonding post portion and an external lead portion;

a semiconductor die having a plurality of signal bonding pads, a plurality of ground bonding pads, and a plurality of power bonding pads on a die surface;

a first plurality of wire bonds connecting the plurality of signal bonding pads to the plurality of signal leads;

a second plurality of wire bonds connecting the plurality of power bonding pads to the outer ring power pad terminals;

a lid overlying, aligned and hermetically sealed to the single layer ceramic base to form a hermetic package body around the semiconductor die, the first and second pluralities of wire bonds, the internal bonding post portion of each signal lead, the inner ground plane, and the outer ring of power pad terminals; and a plurality of solder bumps connected to the bottom surface portion of the ground plane and the power pad terminals by way of the plurality of conductive apertures in the single layer ceramic base, wherein the external lead portion of each signal lead is configured to form a seating plane and wherein the plurality of solder bumps protrudes less than the seating plane to prevent interference with subsequent board mounting of the device.

17. The device of claim 16, wherein the plurality of solder bumps is no more than 0.2 millimeter shorter than a seating plane of the device.

18. The device of claim 16, wherein the plurality of signal leads number at least 200.

19. The device of claim 16, wherein the plurality of conductive apertures is further characterized as filled vias.

* * * * *